United States Patent [19]

Nagumo et al.

[11] Patent Number: 4,498,175
[45] Date of Patent: Feb. 5, 1985

[54] ERROR CORRECTING SYSTEM

[75] Inventors: Masahide Nagumo, Kawasaki; Jun Inagawa, Yokohama; Tadashi Kojima, Yokosuka, all of Japan

[73] Assignee: Tokyo Shibaura Denki Kabushiki Kaisha, Kawasaki, Japan

[21] Appl. No.: 430,002

[22] Filed: Sep. 30, 1982

[30] Foreign Application Priority Data

Jun. 15, 1982 [JP] Japan ................... 57-102816

[51] Int. Cl.³ .................................. G06F 11/10
[52] U.S. Cl. ..................................... 371/37
[58] Field of Search ............. 371/38, 39, 40, 37

[56] References Cited

U.S. PATENT DOCUMENTS

| | | | |
|---|---|---|---|
| 4,142,174 | 2/1979 | Chen et al. | 371/37 |
| 4,413,339 | 11/1983 | Riggle et al. | 371/38 |
| 4,413,340 | 11/1983 | Odaka et al. | 371/39 |
| 4,437,185 | 3/1984 | Sako et al. | 371/37 |

Primary Examiner—Jerry Smith
Assistant Examiner—Michael R. Fleming
Attorney, Agent, or Firm—Cushman, Darby & Cushman

[57] ABSTRACT

An error correcting system uses an error location polynomial which is defined by double correction BCH codes each consisting of the elements of a Galois field $GF(2^m)$, and thereby generates error locations $\sigma_1$ and $\alpha^2$ and error patterns $e_1$ and $2_2$. The system has a first data processing system for performing only addition and multiplication to generate the error locations $\sigma_1$ and $\alpha^2$, and a second data processing system for performing only addition and multiplication to generate the error patterns $e_1$ and $2_2$. The first data processing system comprises a syndrome generator, a memory, an arithmetic logic unit, registers, latch circuits, registers, adder circuits and a zero detector. The second data processing system comprises a gate circuit, latch circuits, an arithmetic logic unit, and the registers of a memory.

4 Claims, 9 Drawing Figures

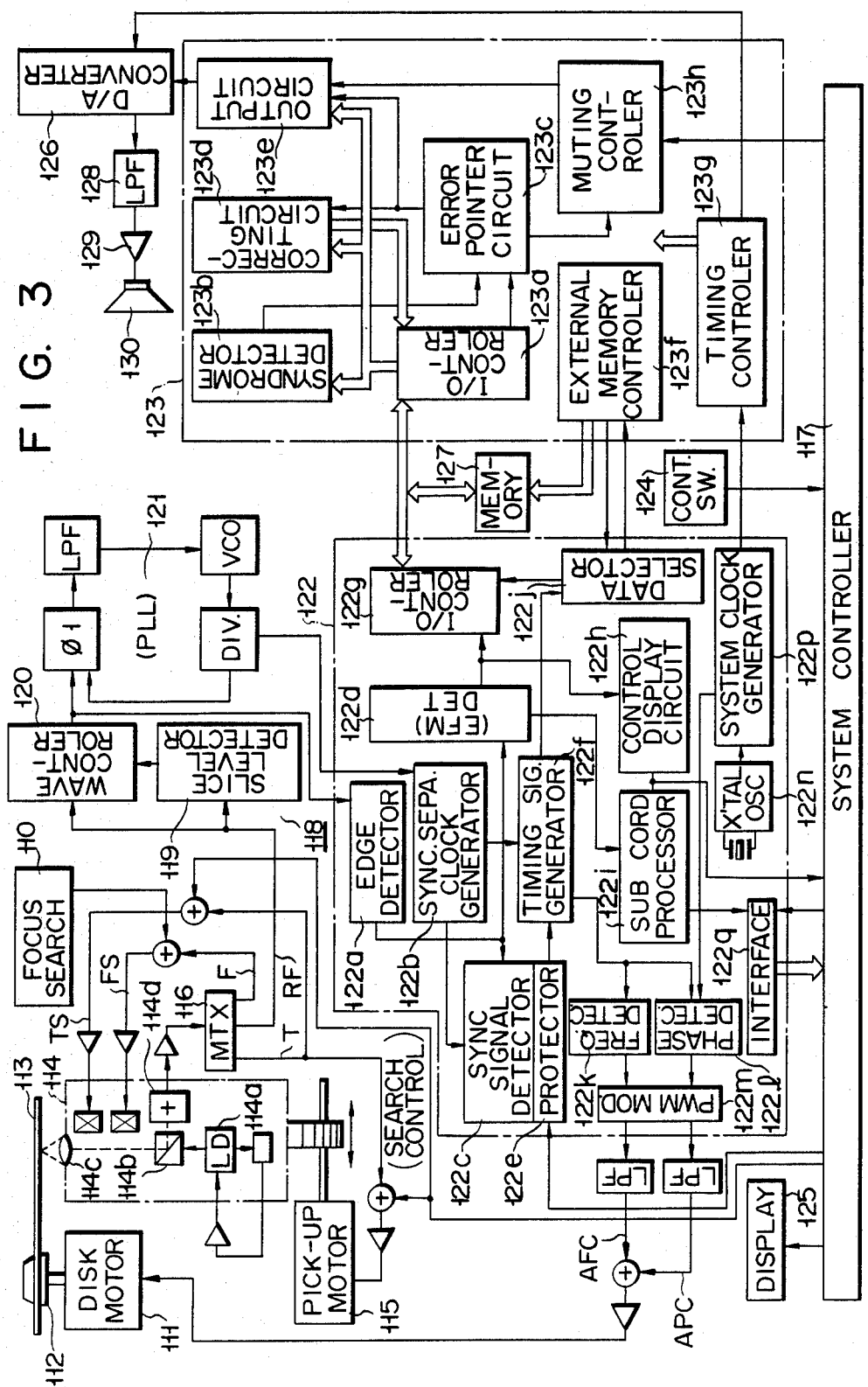
F I G. 3

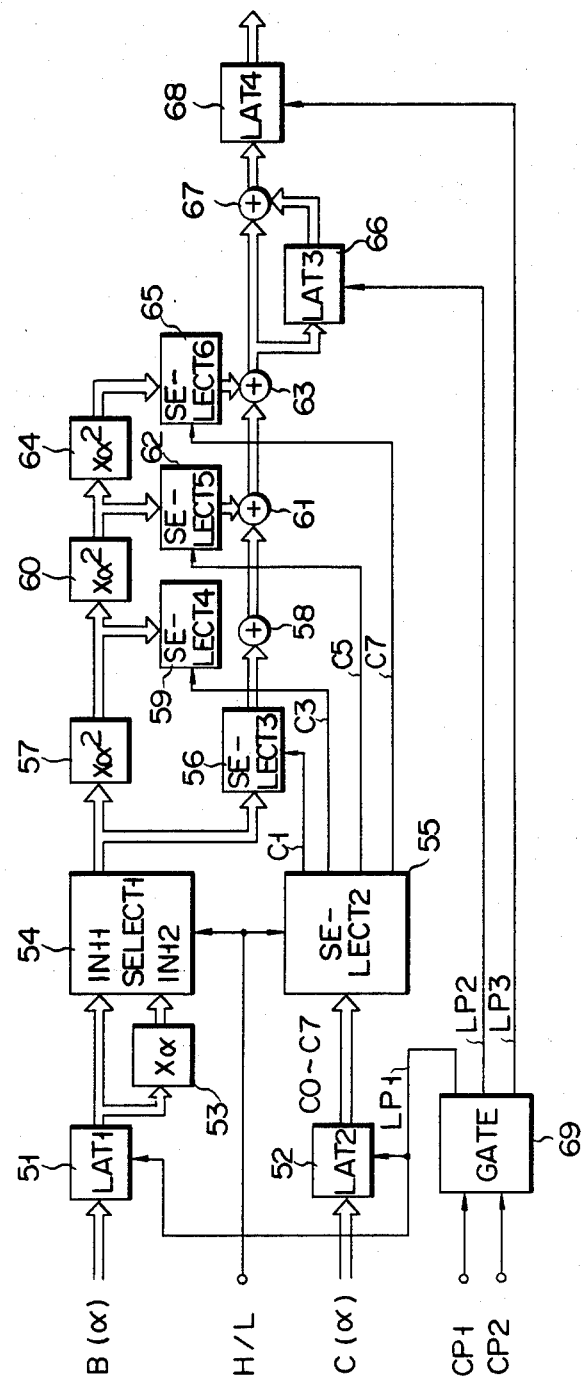
F I G. 6

ERROR CORRECTING SYSTEM

BACKGROUND OF THE INVENTION

The present invention relates to an improved system for correcting errors which can effectively conbined with, for example, a digital audio disk (DAD) device using a compact disk (CD).

Various optical DAD devices have been developed recently. As is well known, an optical DAD device having a CD uses cross interleaved Reed-Solomon codes (CIRC) to correct errors. A CIRC is obtained by submitting a Reed-Solomon code, which is a kind of BCH code and is generally regarded as the most effective random error correction code hitherto known to a signal process called "cross interleaving." The CIRC thus obtained is sensitive enough to correct burst errors.

A Reed-Solomon code can be decoded in the same way as other BCH codes, thereby correcting errors.

A typical Reed-Solomon code consisting of k data symbols and (n-k) inspection symbols, i.e., consisting of n symbols, is decoded in the following manner. Here, n symbols are represented by the $2^m$ elements of a finite field or a Galois field GF $(2^m)$ which represents m binary bits. The generator polynomil $g_{(x)}$ representing the Reed-Solomon code used to correct an error a t number of times is given by the following two equations, where $\alpha$ is the origin element Galois field GF $(2^m)$:

$$g_{(x)} = (x+\alpha)(x+\alpha^2), \ldots (x+\alpha^{2t}), \quad (1)$$

$$g_{(x)} = (x+\alpha^0)(x+\alpha), \ldots (x+\alpha^{2t-1}). \quad (2)$$

If we let $C_{(x)}$, $R_{(x)}$ and $E_{(x)}$ denote a transmitted code word, a received code word and an error polynomial, then:

$$R_{(x)} = C_{(x)} + E_{(x)}. \quad (3)$$

The coefficients contained in polynomial $E_{(x)}$ are also contained in the Galois field GF $(2^m)$. Hence, the error polynomial $E_{(x)}$ contains only those terms which correspond to error locations and the value (i.e., size) of the error.

If we let $X^j$ denote an error location, and let $Y_j$ denote the value of the error at the error location $X^j$, the error polynomial $E_{(x)}$ can then be given as:

$$E_{(x)} = \sum_j Y_j X^j \quad (4)$$

where $\Sigma$ is the sum of the errors at all of the error locations.

Here, syndrome $S_i$ is described:

$$S_i = R(\alpha^i) \ [i=0,1 \ldots 2t-1]. \quad (5)$$

Then, from equation 3 we have:

$$S_i = C(\alpha^i) + E(\alpha^i).$$

Both $C_{(x)}$ and $g_{(x)}$ can be divided without leaving a remainder. As a result, the following therefore holds true:

$$S_i = E(\alpha^i).$$

From equation 4 it is evident that syndrome $S_i$ may be expressed as follows:

$$S_i = E(\alpha^i) = \sum_j Y_j(\alpha^i)^j = \sum_j Y_j X_j^i \quad (6)$$

where $\alpha^j = X_j$, and $X_j$ represents the error location for $\alpha^j$.

Error location polynomial $\sigma_{(x)}$ is given by:

$$\sigma_{(x)} = \pi_i (x - X_i) \quad (7)$$

$$= x^e + \sigma_1 x^{e-1} + \ldots + \sigma_e$$

where e is the number of the errors.

$\sigma_1$ to $\sigma_e$ in Equation 7 are related to syndrome $S_i$ as shown below:

$$S_{i+e} + \sigma_1 S_{i+e-1} + \ldots \sigma_{e-1} S_{i+1} + \sigma_e S_i. \quad (8)$$

To sum up the above, a Reed-Solomon code as defined can be decoded as follows:
(I) Calculate syndrome $S_i$ (Equation 5).
(II) Obtain coefficients $\sigma_1$ to $\sigma_e$ contained in the error location polynomial $\sigma_{(x)}$ (Equation 8).
(III) Find the root $X_j$ of the error location polynomial $\sigma_{(x)}$ (Equation 7).
(IV) Find the error value $Y_j$ (Equation 6) and calculate the error polynomial (Equation 4).
(V) Correct the error (Equation 3).

By using the steps listed above, the steps needed to decode, a Reed-Solomon code consisting of many block data each containing four inspection symbols will be described. This code is represented by the following generator polynomial $g_{(x)}$:

$$g_{(x)} = (x+1)(x+\alpha)(x+\alpha^2)(x+\alpha^3).$$

In this case, an error can be corrected twice. The Reed-Solomon code may then be decoded by following method A or by following method B.

[Method A]
(I) Find syndromes $S_0$ to $S_3$.
(II) Rewrite Equation 8 so that e equals 1 and 2,
In the case of e=1:

$$S_1 + \sigma_1 S_0 = 0,$$

$$S_2 + \sigma_1 S_1 = 0,$$

$$S_3 + \sigma_1 S_2 = 0. \quad (9)$$

In the case of e=2:

$$S_2 + \sigma_1 S_1 + \sigma_2 S_0 = 0,$$

$$S_3 + \sigma_1 S_2 + \sigma_2 S_1 = 0. \quad (10)$$

Assume that the decoder used starts functioning in the case where e=1. A solution $\sigma_1$ must then be given which satisfies the simultaneous Equations 9. If no solution $\sigma_1$ is found, the decoder must find solutions $\sigma_1$ and $\sigma_2$ which satisfy simultaneous Equation 10. If a solution $\sigma_1$ or $\sigma_2$ is not yet found, then: $e \geq 3$.

The solution $\sigma_1$ of Equation 9 can be expressed by:

$$\sigma_1 = \frac{S_1}{S_0} = \frac{S_2}{S_1} = \frac{S_3}{S_2}.$$

The solution $\sigma_1$ and $\sigma_2$ of Equation 10 is:

$$\sigma_1 = \frac{S_1 S_3 + S_1 S_2}{S_1^2 + S_0 S_2} \text{ and } \sigma_2 = \frac{S_1 S_3 + S_2^2}{S_1^2 + S_0 S_2}.$$

(III) If a coefficient $\sigma_1$ in the error location polynomial is obtained, find the root of the error location polynomial (Equation 7).

In the case of e=1:

$$\sigma_{(x)} = x + \sigma_1 = 0. \text{ Therefore, } X_1 = \sigma_1.$$

In the case of e=2:

$$\sigma_{(X)} = x^2 + \sigma_1 x + \sigma_2 = 0 \quad (11)$$

Substituting the elements of the Galois field GF ($2^m$) in Equation 11 one after another will yield roots $X_1$ and $X_2$.

(IV) If the roots of the error location polynomial are found, determine the error value $Y_j$ (Equation 6).

In the case of e=1:

$$S_0 = Y_1. \text{ Therefore, } Y_1 = S_0.$$

In the case of e=2:

$$S_0 = Y_1 + Y_2,$$

$$S_1 = Y_1 X_1 + Y_2 X_2.$$

Therefore:

$$Y_1 = \frac{X_2 S_0 + S_1}{X_1 + X_2} \text{ and } Y_2 = S_0 + Y_1.$$

(V) Correct the error by using the correction values $Y_1$ and $Y_2$ thus obtained.

If the value of an error location is correctly found by the pointer erasure method, the Reed-Solomon code used to correct an error twice can be used to correct an error four times in method B.

[Method B]

(I) Find syndromes $S_0$ to $S_3$.

(II), (III) Find the error location by using different methods.

(IV) Find the error value (Equation 6).

In the case of e=1:
See Method A.
In the case of e=2:
See Method A.
In the case of e=3:

$$S_0 = Y_1 + Y_2 + Y_3,$$

$$S_1 = Y_1 X_1 + Y_2 X_3 + Y_3 X_3,$$

$$S_2 = Y_1 X_1^2 + Y_2 X_2^2 + Y_3 X_3^2.$$

Solve these simultaneous equations, thus finding $Y_1$, $Y_2$ and $Y_3$:

$$Y_1 = \frac{(S_2 + X_3 S_1) + X_2(S_1 + X_3 S_0)}{(X_1 + X_2)(X_1 + X_3)},$$

$$Y_2 = \frac{(S_1 + X_3 S_0) + Y_1(X_1 + X_3)}{(X_2 + X_3)},$$

$$Y_3 = S_0 + Y_1 + Y_2.$$

In the case of e=4:

$$S_0 = Y_1 + Y_2 + Y_3 + Y_4,$$

$$S_1 = Y_1 X_1 + Y_2 X_2 + Y_3 X_3 + Y_4 X_4,$$

$$S_2 = Y_1 X_1^2 + Y_2 X_2^2 + Y_3 X_3^2 + Y_4 X_4^2,$$

$$S_3 = Y_1 X_1^3 + Y_2 X_2^3 + Y_3 X_3^3 + Y_4 X_4^3.$$

Solve these simulataneous equations, thus finding $Y_1$, $Y_2$, $Y_3$ and $Y_4$:

$$Y_1 = \frac{\{(S_0 X_4 + S_1) X_3 + (S_1 X_4 + S_2)\} X_2 + (S_1 X_4 + S_2) X_3 + (S_2 X_4 + S_3)}{(X_1 + X_2)(X_1 + X_3)(X_1 + X_4)},$$

$$Y_2 = \frac{(S_0 X_4 + S_1) X_3 + (S_1 X_4 + S_2) + Y_1(X_1 + X_3)(X_1 + X_4)}{(X_2 + X_3)(X_2 + X_4)},$$

$$Y_3 = \frac{(S_0 X_4 + S_1) + Y_1(X_1 + X_4) + Y_2(X_2 + X_4)}{(X_3 + X_4)}.$$

$$Y_4 = S_0 + Y_1 + Y_2 + Y_3.$$

(V) Correct the error, using correction values $Y_1$, $Y_2$, $Y_3$ and $Y_4$ thus obtained.

FIG. 1 is a block diagram of a known data correcting system which is designed to decode Reed-Solomon codes in the manner described above. A data to be corrected by a Reed-Solomon code is supplied through an input terminal IN. The data is stored into a data buffer 11 and is kept there until code decoding (described later) is completed. The data is also supplied to a syndrome calculator 12. Using the input data, the calculator 12 calculates syndromes. The syndromes are stored into a syndrome buffer 13.

An OR gate 14 is coupled to the output of the syndrome buffer 13. The OR gate 14 generates two output signals which indicates whether or not an error exists in the syndromes supplied from the syndrome buffer 13. An output signal from the OR gate is supplied to an error location polynomial calculator 15. Upon receipt of the signal, the calculator 15 finds the coefficients in the error location polynomial $\sigma_{(x)}$. Data representing the coefficients is fed to an error location calculator 16. The error location calculator 16 then finds the root or roots of the error location. Data representing the root or roots is supplied from the calculator 16 to an error value calculator 17. From the input, the calculator 17 calculates the value of the error. The data representing the root or roots, and the data representing the error value are used to correct the data from the data buffer 11.

The calculators 12, 15, 16 and 17 of the data correcting system can detect elements which have a value of "0", and can perform addition, multiplication or division. Of these calculators, the error location polynomial calculator 15 may have the structure shown in FIG. 2 which is disclosed in U.S. Pat. No. 4,142,174.

As shown in FIG. 2, the error location polynomial calculator 16 comprises a syndrome buffer 21, a working buffer 22, a sequence controller 23, a logarithm buffer 24 and an antilogarithm buffer 25. The syndrome buffer 21 is a random-access memory (RAM) for storing a syndrome Si which consists of m-bit data and which represents each element of a Galois field GF ($2^m$). The working buffer 22 is a RAM for storing the interim result of an algebraic operation performed to find the coefficients of the error location polynomial, and for storing the final result of the operation. The working buffer 22 may store partial results which are used in the operations following the calculation of the coefficients of the error location polynomial. The sequence controller 23 defines the order in which the algebraic operations will be performed. It supplies address signals to the syndrome buffer 21 and the working buffer 22, thereby designating the desired memory locations of these buffers 21 and 22, and thereby checking and branching the results of the algebraic operations which are used in the next algebraic operations. The logarithm buffer 24 is a ROM (read-only memory) and stores a table of the logarithms of the elements of the Galois field GF ($2^m$). The antilogarithm buffer 25 is also a ROM and stores a table of the antilogarithms of the elements of Galois field GF ($2^m$).

The address of the logarithm buffer 24 is a binary code of element $\alpha^i$. Its entry is the logarithm of $\alpha$ to the base $\alpha$, that is, i. The entry at address i of the antilogarithm buffer 25 is a binary code of $\alpha^i$.

Suppose the modulus polynomial $F_{(x)}$ of the Galois field GF($2^8$) is given by:

$$F_{(x)} = x^8 + x^6 + x^5 + x^4 + 1.$$

Then, the element of the Galois field GF ($2^m$) other than element 0 can be represented by a linear combination of powers to the root $\alpha$ of $F_{(x)}=0$, or $\alpha^0 - \alpha^7$, which is expressed as follows:

$$\sum_{i=0}^{7} a_i \alpha^i \ (a_i = 0 \text{ or } 1).$$

In this case, eight coefficients $a_0$ to $a_7$ can be used and can be presented as binary vectors. For example, they can be given by:

$$\alpha^1 = 0 \cdot \alpha^0 + 1 \cdot \alpha^1 + 0 \cdot \alpha^2 + 0 \cdot \alpha^3 + 0 \cdot \alpha^4 + 0 \cdot \alpha^5 + 0 \cdot \alpha^6 + 0 \cdot \alpha^7$$
$$= (01000000),$$

$$\alpha^7 = 0 \cdot \alpha^0 + \ldots + 0 \cdot \alpha^6 + 1 \cdot \alpha^7$$
$$= (00000001),$$

$$\alpha^8 = 1 + \alpha^4 + \alpha^5 + \alpha^6$$
$$= (10001110),$$

$$\alpha^9 = \alpha \cdot \alpha^8 = \alpha + \alpha^5 + \alpha^6 + \alpha^7$$
$$= (01000111).$$

The elements of the Galois field GF ($2^8$) other than the above can be represented as binary vectors.

The addresses (1-255) of the logarithm table are 8-bit binary vectors of elements $\alpha^i$. Entries corresponding to the addresses are binary notations of the exponent i. In the antilogarithm table, exponent i is used as an address, and the entries are binary vectors of $\alpha^i$.

Now it will be described how the error location polynomial calculator shown in FIG. 2 performs algebraic operations.

(1) Addition

In order to add element $\alpha^i$ and element $\alpha^j$, the former supplied from an A register 20 to an exclusive OR gate 27 and the latter is supplied from a B register 26 to the exclusive OR gate 27. An exclusive logic sum of each bit of element $\alpha^i$ and the corresponding bit of element $\alpha^j$ is thus produced. The sum of elements $\alpha^i$ and $\alpha^j$ obtained by the exclusive OR gate 27 is transferred through a C register 19 to the working buffer 22.

(2) Detecting if the Element is 0

In order to detect whether or not element $\alpha^i$ is 0, the element is supplied from the H register 28 to an OR gate 29, which produces a logic sum. The logic sum is transferred via an M register 30 to the working buffer 22. The contents of the M register 30 are 0 only when element $\alpha^i$ is 0.

(3) Multiplication

In order to multiply element $\alpha^i$ by element $\alpha^j$, it is first detected whether or not these elements are 0. If at least one of these elements is 0, it is obvious that the product will also be 0 and so multiplication is not performed. If neither element is 0, they are loaded into an address register 31 which is connected to the logarithm buffer 24. Outputs i and j from the logarithm buffer 24 are supplied to an adder 34 through a D register 32 and E register 33, respectively. The adder 34 adds a complement of 1, using $2^8 - 1$ as modulo. The result of this addition, $(i+j) = t \mod (2^8 - 1)$ is loaded through an L register 35 into an address register 36 which is connected to the antilogarithm buffer 25. If the address input of the antilogarithm buffer 25 is t, the antilogarithm buffer 25 supplies an output $\alpha^t$. The output $\alpha^t$ is the product of elements $\alpha^i$ and $\alpha^j$ and is transferred to the working buffer 22 through a G register 37.

(4) Division

In order to divide element $\alpha^i$ by element $\alpha^j$ to obtain a quotient $\alpha^i/\alpha^j$, a method similar to the above-mentioned multiplication is used, but the contents of the E register 33 are subtracted from the contents of the D register 32. More specifically, the logarithm of the element $\alpha_j$ stored in the E register 33 is complemented by a complementer 38. The output data of the complementer 38 is supplied to the complement adder 34 through a F register 39. Thereafter, the data is processed in the same way as when multiplying element $\alpha^i$ by element $\alpha^j$. In this case, the output from the antilogarithm buffer 25 is the quotient, i.e., the result of the division.

The error location polynomial calculator of the known error correcting system must be provided with a logarithm buffer and an antilogarithm buffer. Without the logarithm buffer and the antilogarithm buffer, the error location polynomial calculator could not perform multiplication or division. Both buffers, which are ROMs, need to have an enormously large memory capacity. This makes it difficult to manufacture the error location polynomial calculator in the form of an LSI. If the calculator may be made into an LSI, the logarithm buffer and the antilogarithm buffer are excluded from the calculator. In this case, the buffers of a large memory capacity have to be connected to the calculator.

If one symbol consists of eight bits and if each buffer stores 255 symbols, the buffer must have a memory capacity of 2040 bits (255×8). In this case, the known error location polynomial calculator is provided with two ROMs, the total memory capacity of which amounts to 4080 bits: one ROM storing a table of logarithms and the other ROM storing a table of antilogarithms. However, if the error location polynomial calculator has two ROMs of a large memory capacity, the error correcting system is inevitably complicated and is thus expensive.

SUMMARY OF THE INVENTION

It is an object of the present invention to provide an error correcting system which can perform algebraic operations such as multiplication and division on the elements of the Galois field thereby finding error locations or error patterns, without using a logarithm buffer or an antilogarithm buffer having a large memory capacity, and which has therefore a simple structure and is rather inexpensive.

Another object of the invention is to provide an error correcting system which can perform algebraic operations in a short time.

An error correcting system according to the present invention receives double correction BCH codes each consisting of M data symbols and four parity symbols, each consisting of $m$ bits and represented by the following generated polynomial:

$$g_{(x)} = (x+1)(x+\alpha)(x+\alpha^2)(x+\alpha^3),$$

where $\alpha$ is the origin element of Galois field GF ($2^m$), and which find the roots of the following error location polynomial:

$$f_{(x)} = x^2 + \sigma_1 x + \sigma_2,$$

thereby correcting errors in the double correction BCH codes. This system comprises:

means for storing the double correction BCH codes;

syndrome generating means for generating four syndromes $S_0$, $S_1$, $S_2$ and $S_3$ from the double correction BCH codes;

error location calculating means comprising:

a first multiplying/adding section for multiplying and adding the four syndromes $S_0$, $S_1$, $S_2$ and $S_3$ to obtain three syndromes $S_a$, $S_b$ and $S_c$ which are given as follows:

$$S_a = S_1{}^2 + S_0 S_2,$$

$$S_b = S_0 S_3 + S_1 S_2,$$

$$S_c = S_1 S_3 + S_2{}^2$$

a second multiplying/adding section for performing multiplication and addition by substituting $\alpha^0 - \alpha^{M+3}$ for $x$ in the following polynomial obtained by transforming said error location polynomial $f_{(x)}$:

$$f'_{(x)} = S_a f_{(x)} = S_a x^2 + S_b x + S_c,$$

thereby obtaining two products $S_a \cdot \alpha^2$ and $S_b \cdot \alpha$ and a sum $S_a \alpha^2 + S_b \alpha + S_c$, utilizing the fact that the coefficients $\sigma_1$, $\sigma_2$ of said error location polynomial $f_{(x)}$ and the three syndromes $S_a$, $S_b$ and $S_c$ have the following relations according to the theory on the correction of said double correction BCH codes:

$$\sigma_1 = S_b / S_a = \alpha^i + \alpha^j,$$

$$\sigma_2 = S_c / S_a + \alpha^i \alpha^j;$$

an $\alpha^i$, $\alpha^j$ detecting section for detecting $\alpha^i$ and $\alpha^j$ which satisfy $f'_{(x)} = 0$; and A third multiplying/adding section for adding $\alpha^i$ and $\alpha^j$ and multiplying $\alpha^i$ by $\alpha^j$, thereby finding the coefficients $\sigma_1$, $\sigma_2$ which define error locations;

error pattern calculating means comprising a fourth multiplying/adding means for obtaining an error pattern $e_i$ from $\alpha^i$ and $\alpha^j$ by performing the following multiplication:

$$e_i = (S_0 \alpha^j + S_1)(\alpha^i + \alpha^j)^{-1},$$

said equation having been derived from the following division:

$$e_i = \frac{S_0 \alpha^j + S_1}{\alpha^i + \alpha^j},$$

and for obtaining another error pattern $e_j$ by performing the following addition:

$$e_j = S_0 + e_i; \text{ and}$$

correction means for correcting the errors in said double correction codes stored by said code storing means in accordance with the coefficients $\sigma_1$, $\sigma_2$ and the error patterns $e_i$, $e_j$. Therefore, the system need not be provided with a memory with a large capacity, and can have a simple structure and be inexpensive. Further, the system can process data at a high speed.

BRIEF DESCRIPTION OF THE DRAWINGS

FIG. 3 is a block diagram of a DAD device to which the present invention is applied;

FIG. 6 is a block diagram of a multiplier used in the operation unit of the system shown in FIG. 4;

DETAILED DESCRIPTION OF THE PREFERRED EMBODIMENT

Figure 1:
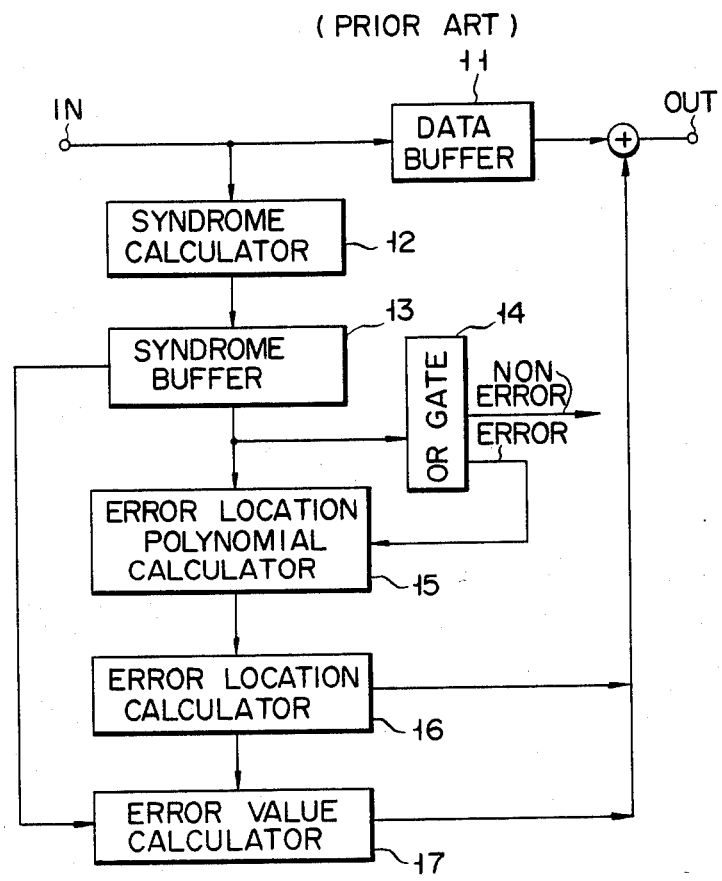
FIG. 1 is a block diagram of a known error data correcting system.
Figure 2:
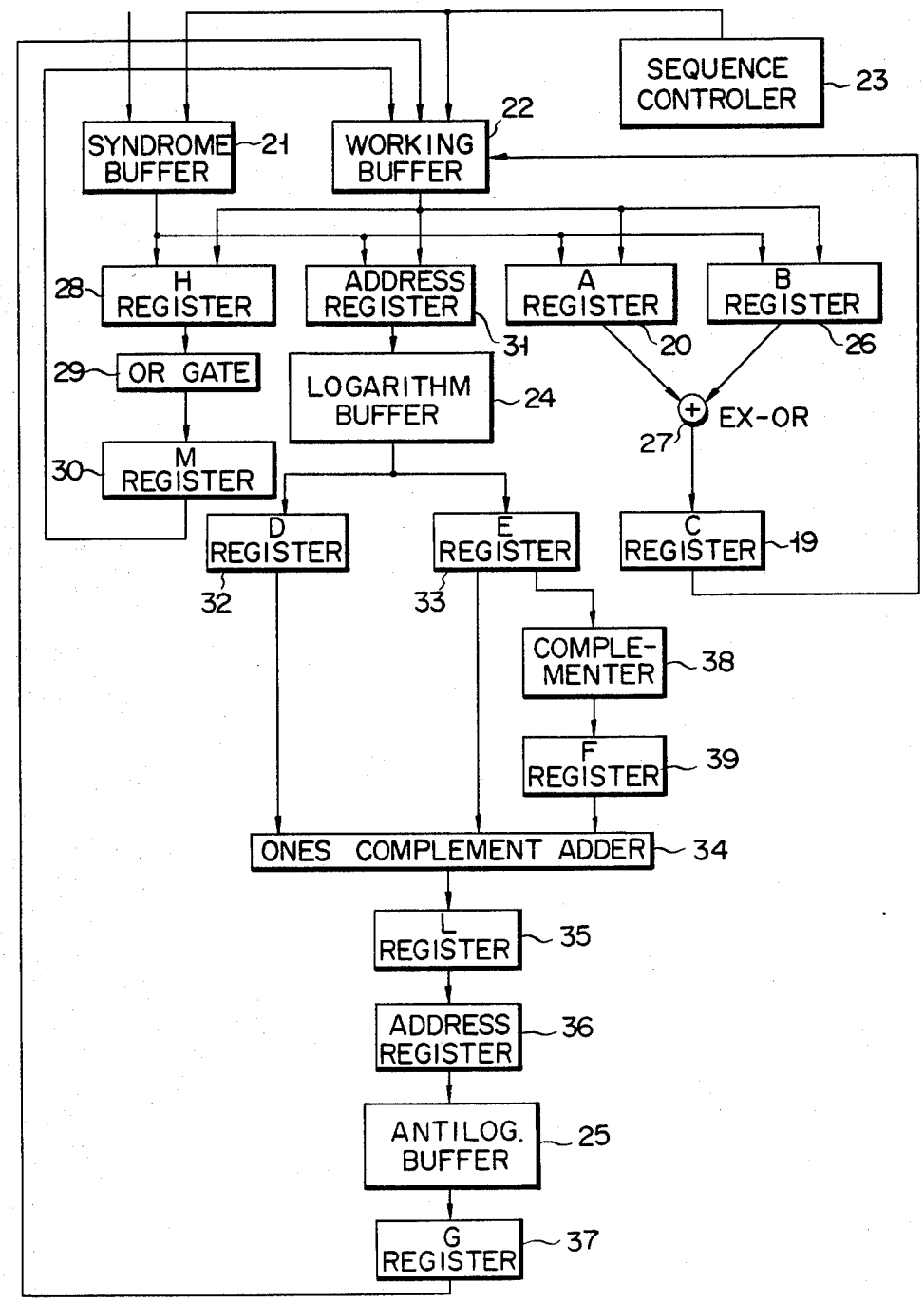
FIG. 2 is a block diagram of an error location polynomial calculator used in the system shown in FIG. 1.

With reference to FIG. 3, an optical digital audio disk (DAD) device which uses compact disks (CD) will be described.

As shown in FIG. 3, the DAD device comprises a disk motor 111 for rotating a turntable 112. On the turntable 112 an optical disk 113 is mounted. The disk 113 has pits which corresponds to digital audio signals (i.e., PCM codes) which have been EFM-modulated and interleaved. An opitcal pickup 114 emits a laser beam from a semiconductor laser 114a. The laser beam passes through a beam splitter 114b and is focused by an object lens 114c. The beam illuminates the track of the optical disk 113. The beam reflected from the pits passes through the objective lens 114c and the beam splitter 114b. It is then guided to a four-element photodetector 114d. The photodetector 114d converts the laser beam into four signals. The pickup 114 is moved by a pickup feed motor 115 in the radial direction of the optical disk 113.

The four signals from the photodetector 114d are supplied to a matrix circuit 116 and undergo a specific matrix operation. As a result, the matrix circuit 116 generates a focus error signal F, a tracking error signal T, and a high-frequency signal RF. The focus error signal F and a focus search signal from a focus search circuit 110 are used to drive a focus servo system of the optical pickup 114. The tracking error signal T and the search control signal supplied from a system controller 117 are used to drive a tracking servo system of the optical pickup 114 and to control the pickup feed motor 115. The high-frequency signal RF is supplied to a reproduced signal processing system 118 as a major reproduced signal component. In the system 118 the signal RF is supplied to a waveform shaping circuit 120 which is controlled by a slice level (eye pattern) detector 119. The waveform shaping circuit 120 divides the input signal into an unnecessary analog component and a necessary data component. The necessary data component is supplied to a sync clock reproducing circuit 121 of a PLL type and also to an edge detector 122a of a first signal processing system 122.

A sync clock from the sync clock reproducing circuit 121 is supplied to a clock generating circuit 122b of the first signal processing system 122. In response to the sync clock, the clock generating circuit 122b generates a clock for dividing a sync signal into components. On the other hand, the necessary data component from the edge detector 122a is supplied to a sync signal detector 122c. The sync signal detector 122c divides the data components in response to a sync signal dividing clock from the clock generating circuit 122b. The necessary data component from the edge detector 122a is supplied also to a demodulating circuit 122d and then is EFM-demodulated. A sync signal from the sync signal detector 122c is supplied to a sync signal protecting circuit 122e and then to a timing signal generating circuit 122f. A clock from the clock generating circuit 122b is supplied also to the timing signal generating circuit 122f. The timing signal generating circuit 122f generates a timing signal for processing the input data.

An output signal from the demodulating circuit 122d is supplied through a data bus input/output control circuit 122g to an input/output control circuit 123a of a second signal processing system 123. The output signal from the demodulating circuit 122d contains a subcode (i.e., a control signal) and a display signal component. The display signal component is supplied to a control display processing circuit 122h and the subcode is supplied to a subcode processing circuit 122i.

The subcode processing circuit 122i detects an error, if any, from the subcode; and then corrects the error and generates subcode data. The subcode data is supplied to the system controller 117 through an interface circuit 122q which is connected to the system controller 117.

The system controller 117 includes a microcomputer, an interface circuit, and a driver integrated circuit. In response to an instruction from a control switch 124 the system controller 117 controls the DAD device in a desired manner and causes a display device 125 to display the subcode (e.g., index data about a piece of music to be reproduced).

A timing signal from the timing generating circuit 122f is supplied through a data selecting circuit 122j to the data bus input/output control circuit 122g and controls the data bus input/output control circuit 122g. The timing signal is also supplied to a frequency detector 122k, a phase detector 122l and further to a PWM modulator 122m. The timing signal from the PWM modulator 122m then undergoes automatic frequency control (AFC) and automatic phase control (APC) so as to rotate the disk motor 111 at a constant linear velocity (CLV).

The phase detector 122l is connected to receive a system clock from a system clock generating circuit 122p, which operates under the control of an output signal from a quartz crystal oscillator 122n.

The demodulated data from the input/output control circuit 123a of the second signal processing system 123 is supplied through a data output circuit 123e to a D/A (digital-to-analog) converter 126 after it has undergone the necessary error correction, deinterleaving and data supplementation at a syndrome detector 123b, at an error pointer control circuit 123c, and at an error correction circuit 123d. The second signal processing system 123 includes an external memory control circuit 123f. The control circuit 123f cooperates with the data selecting circuit 122j of the first signal processing system 122 to control an external memory 127 which stores the data necessary for correcting errors. Under the control of the circuits 123f and 122j, the data is read from the external memory 127 and is supplied to the input/output control circuit 123a.

The second signal processing system 123 further comprises a timing control circuit 123g and a muting control circuit 123h. The timing control circuit 123g is so designed as to supply, in response to a system clock from the system clock generating circuit 122p, a timing control signal which is necessary in correcting errors, supplementing data and converting digital data into analog data. The muting control circuit 123h, in response to a control signal from the error pointer control circuit 123c or from the system controller 117, is designed to perform the specific muting control which is necessary in supplementing data, and in starting and ending DAD reproduction.

An audio signal, or an analog output signal from the D/A converter 126 is supplied through a low pass filter 128 and an amplifier 129 to a loudspeaker 130.

Now, the error data correcting system according to the present invention, which is applied to the DAD device described above, will be described in detail.

The principle of the error data correcting system will first be described. A double correction BCH code consists of symbols which are the elements of the Galois field $GF(2^8)$ and which are:

$$U_0, U_1, U_2 \ldots U_{M-1}, P_0, P_1, P_2, P_3. \quad (12)$$

$U_0, - U_{M-1}$ are data symbols, each being an 8-bit symbol. $P_0-P_3$ are parity symbols. That is, M data symbols and four parity symbols make the double correction BCH code. Equation 12 implies that the parity symbols are regarded as being identical to the data symbols so far as error correction is concerned. Equation 12 may be changed to:

$$W_{M+3}, W_{M+2}, W_{M+1} \ldots W_3, W_2, W_1, W_0. \quad (13)$$

Hence, the transmission polynomial $F_{(x)}$ is given by:

$$F_{(x)} = W_{M+3} x^{M+3} + W_{M+2} x^{M+2} + \ldots + W_1 x + W_0. \quad (14)$$

And the reception polynominal $F'_{(x)}$, is given by:

$$F_{(x)} = W_{M+3} x^{M+3} + W_{M+2} x^{M+2} + \ldots W_1 x + W_0. \quad (15)$$

Let $\alpha$ denote one of the roots of the generator polynomial $G(x)$ of the Galois field $GF(2^8)$. The transmission polynomial then has four roots 1, $\alpha$, $\alpha^2$ and $\alpha^3$. Therefore:

$$F(1) = \sum_{i=0}^{M+3} W_i = 0, \quad (16)$$

$$F(\alpha) = \sum_{i=0}^{M+3} W_i \alpha^i = 0,$$

$$F(\alpha^2) = \sum_{i=0}^{M+3} W_i (\alpha^2)^i = 0,$$

$$F(\alpha^3) = \sum_{i=0}^{M+3} W_i (\alpha^3)^i = 0.$$

From the transmitting station such parity symbols as would satisfy Equation 13 are transmitted, while at the receiving station those parity symbols which are distored by the transmission system are detected as errors and are then corrected.

In the case of the double error BCH code described above, two symbol errors at most can be corrected. Suppose two symbols $W_j'$ and $W_i'$ included in the reception polynomial $F_{(x)}'$ are erroneous. Then:

$W_i' = W_i + e_i$, $W_j' = W_j + e_j$.

If symbol other than the symbols $W_i'$ and $W_j'$ is erroneous:

$W_k' = W_k$ ($k=0$ to $M=4$, $k \neq i$, $k \neq j$).

Substituting 1, $\alpha$, $\alpha^2$ and $\alpha^3$ in the reception polynomial $F_{(x)}'$ or in Equation 15, yields:
$F_{(1)}' = e_i + e_j = S_0$,
$F_{(\alpha)}' = e_i \alpha^i + E_j \alpha^j = S_1$, $F_{(\alpha^2)}' = e_i \alpha^{2i} + e_j \alpha^{2j} = S_2$, $F_{(\alpha^3)}' = e_i \alpha^{3i} + e_j \alpha^{3j} = S_3. \quad (17)$ Here, $S_0 - S_3$ are syndromes, each representing the value given in Equation 17 in case two symbols error of $(M+4)$ symbols constitute the double correction BCH code.

In the double correction BCH code theory, the error location polyomial as described above may be used. If this is the case:

$$\sigma_1 = \alpha^i + \alpha^j = \frac{S_0 S_3 + S_1 S_2}{S_1^2 + S_0 S_2}, \quad (18)$$

-continued $$\sigma_2 = \alpha^i \alpha^j = \frac{S_1 S_3 + S_2^2}{S_1^2 + S_0 S_2}, \quad (19)$$

$$f_{(x)} = x^2 + \sigma_1 x + \sigma_2. \quad (20)$$

That is, from syndromes $S_0$ to $S_3$, $\sigma_1$ and $\sigma_2$ are obtained in such way as indicated by Equations 18 and 19. $\sigma_1$ and $\sigma_2$ obtained are then substituted in Equation 20. In this case, x in Equation 20 is substituted by $\alpha^0$, $\alpha^1$, $\alpha^2$ ... $\alpha^{M+3}$, one after another. Obviously, $f_{(x)} = 0$ when x is substituted by $\alpha^i$ and $\alpha^j$. Two error locations will thus be found where $f_{(x)} = 0$.

Two error patterns are obtained by using the known $\alpha^i$ and $\alpha^j$. More specifically, from Equation 17 we have:

$$e_i = \frac{S_0 \alpha^j + S_1}{\alpha^i + \alpha^j}, \quad (21A)$$

$$e_j = S_0 + e_i. \quad (21B)$$

As mentioned above, the object of the present invention is to provide a system which can correct erroneous data, and which can perform multiplication and division on the elements of a Galois field without using a memory having a large memory capacity. However, without a memory of a large memory capacity it would be difficult to divide the elements of a Galois field with a generator polynomial $g_{(x)}$, though it is possible to perform relatively simple multiplication. It is therefore preferred that as liitle division as possible be done in order to obtain the error locations and the error patterns.

The error locations are generated in the following manner.

The denominator in the right side of Equation 18 is identical with that in the right side of Equation 19. Let $S_a$, $S_b$ and $S_c$ be put to be:
$S_a = S_1^2 + S_0 S_2$, $S_b = S_0 S_3 + S_1 S_2$, $S_c = S_1 S_3 + S_2^2. \quad (22)$ Then, Equations 18 and 19 can be changed to:

$$\alpha_1 = \alpha^i + \alpha^j = \frac{S_b}{S_a}, \quad (23)$$

$$\alpha_2 = \alpha^i \alpha^j = \frac{S_c}{S_a}. \quad (24)$$

Substituting Equations 23 and 24 in Equation 20 will yield:

$$f_{(x)} = x^2 + \frac{S_b}{S_a} x + \frac{S_c}{S_a}. \quad (25)$$

Equation 25 shows that error locations will be identifed if x is substituted by $\alpha^0$, $\alpha^1$, $\alpha^2$ ... $\alpha^{M+3}$, thereby finding the locations where $f_{(x)} = 0$. Even if Equation 25 is changed to the following one:

$$f_{(x)}' = S_a f_{(x)} = S_a x^2 + S_b x + S_c. \quad (26)$$

$\alpha^i$ and $\alpha^j$ can be identified by substituting x with $\alpha^0$, $\alpha^1$, $\alpha^2$ ... $\alpha^{M+3}$ one after another and by finding the points where $f_{(x)}' = 0$. In this way, an error location polynomial can be generated without performing division.

The error patterns are generated in the following manner.

The right side of Equation 21A which represents the operation of division is:

$$\frac{S_0\alpha^j + S_1}{\alpha^i + \alpha^j}.$$

If the reciprocal $(\alpha^i + \alpha^j)^{-1}$ of the denominator $(\alpha^i + \alpha^j)$ of the right side is known, Equation 21A can then be changed to:

$$e_i = (S_0 \alpha^j + S_1)(\alpha^i + \alpha^j)^{-1}. \tag{21A'}$$

That is, no division needs to be performed in order to find $e_i$. Reciprocal $(\alpha^i + \alpha^j)^{-1}$ is obtained in the following way. First, Equation 26 is substituted in Equation 23:

$$f_{(x)}' = S_a x^2 + S_a(\alpha^i + \alpha^j)x + S_c. \tag{27}$$

In order to locate errors it is necessary to substitute x in Equation 27 with $\alpha^0, \alpha^1, \alpha^2 \ldots \alpha^{M+3}$. While substituting x by $\alpha^0, \alpha^1, \alpha^2 \ldots \alpha^{M+3}$ one after another, the value for x which would satisfy the following Equation 28 is calculated.

$$S_a(\alpha^i + \alpha^j)x = \alpha^r. \tag{28}$$

More specifically, assume that $M = 28$. Then, x in Equation 28 must be substituted by $\alpha^0$ to $\alpha^{31}$. The greatest element of the Galois field $GF(2^8)$ is:

$$\alpha^{2^8 - 1} = \alpha^{255} = 1.$$

Obviously, $\alpha^{255}$ is identical to $\alpha^0$. In other words, $\alpha^{255}$ is a cyclic code for elements $\alpha^0 - \alpha^{254}$. It is therefore sufficient to substitute only $\alpha^0 - \alpha^{254}$ for x in Equation 28 in order to locate the errors.

In this case, $\alpha^0 - \alpha^{31}$ can be substituted for x. Since $7 < 255/32 < 8$, eight items of data $\alpha^{-32m}$ (m=0 to 7) and eight items of reciprocal data $\alpha^{-32m}$ (m=0 to 7) are encoded as shown in the following table:

| $\alpha^{32m}$ | $\alpha^{-32m}$ |
|---|---|
| $\alpha^0$ | $\alpha^{255}$ |
| $\alpha^{32}$ | $\alpha^{223}$ |
| $\alpha^{64}$ | $\alpha^{191}$ |
| $\alpha^{96}$ | $\alpha^{159}$ |
| $\alpha^{128}$ | $\alpha^{127}$ |
| $\alpha^{166}$ | $\alpha^{95}$ |
| $\alpha^{192}$ | $\alpha^{63}$ |
| $\alpha^{224}$ | $\alpha^{31}$ |
| m = 0, 1, 2 ... 7 | |

That is, while substituting $\alpha^0 - \alpha^{31}$ for x, $S_a(\alpha^i + \alpha^j)x$ will be equal to $\alpha^{32m}$ when $r = 32m$. Suppose $x = \alpha^q$ when $S_a(\alpha^i + \alpha^j)x$ equals $\alpha^{32m}$. Then, Equation 28 is changed to the following:

$$S_a(\alpha^i + \alpha^j)\alpha^q = 32m. \tag{29}$$

From $\alpha^q$ and the table given above, $\alpha^{-32m}$ is identified. Hence:

$$(\alpha^i + \alpha^j)^{-1} = S_a \cdot \alpha^q \cdot \alpha^{-32m}. \tag{30}$$

To sum up the above, the data processing time can be reduced if reciprocal data which is necessary for obtaining the error pattern is given while the errors are being located.

Now, an embodiment of the invention which is based on the above-mentioned principle will be described with reference to FIG. 4.

Figure 4:
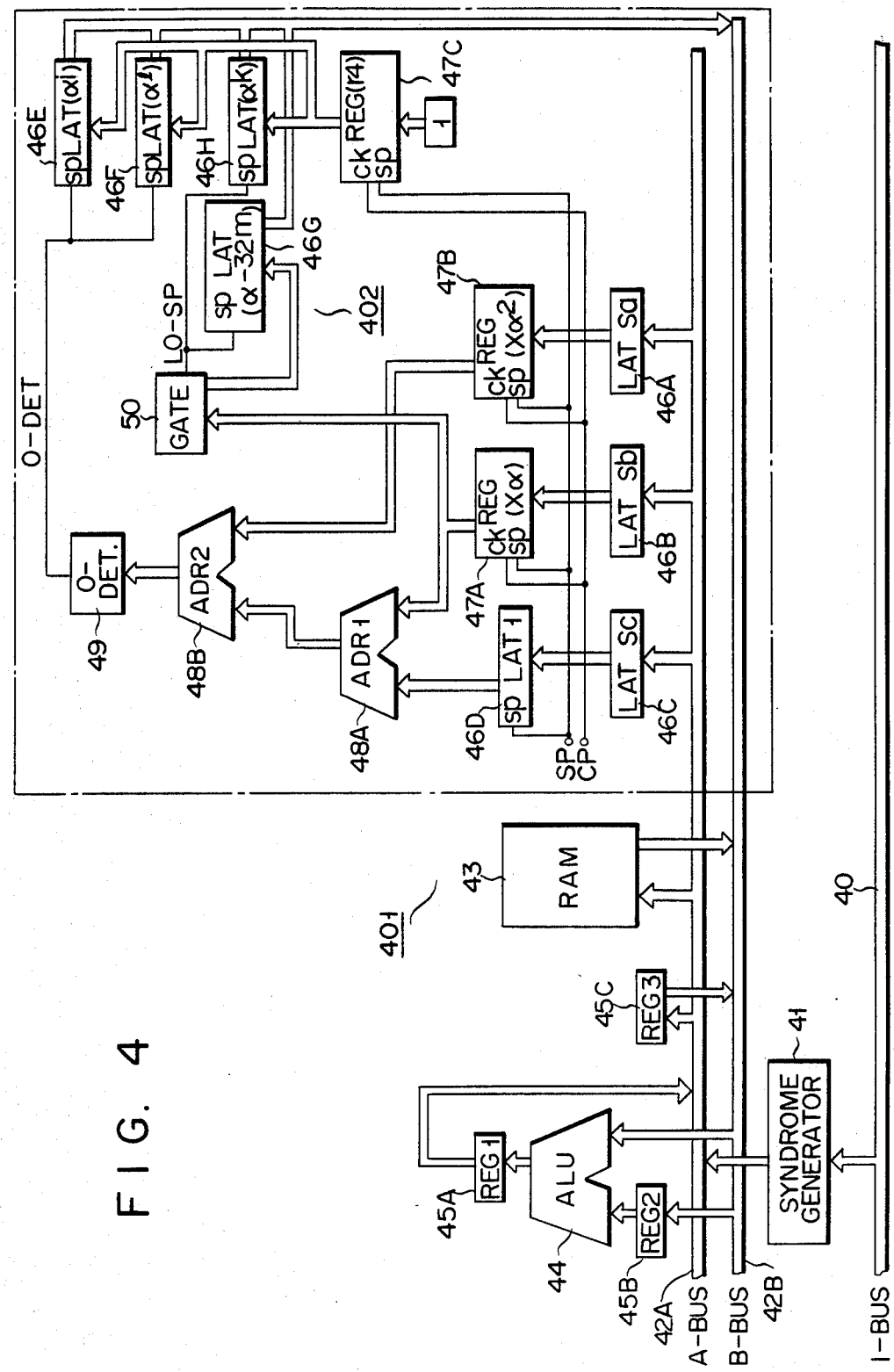
FIG. 4 is a block diagram of the main part of an error data correcting system according to the invention.

FIG. 4 is a block diagram of the error location (polynomial) calculating unit which is included chiefly in the correction circuit 123d of the second signal processing system 123 shown in FIG. 3. The calculating unit performs various algebraic operations in order to decode a Reed-Solomon code (i.e., error correction code), which as was mentioned before is a kind of a BCH code used in correcting errors, and thereby to generate the error locations and the error patterns. The only algebraic operations which need to be performed in order to generate the error locations and the error patterns are addition and multiplication; no division is necessary.

The error location calculating unit decodes a Reed-Solomon code as will be described below.

Reproduced symbols $W_{M+3}, W_{M+2}, W_{M+1} \ldots, W_0$ from a input bus (I-BUS) 40 are supplied to a syndrome generator (SYNDROME GEN.) 41 which corresponds to the syndrome detector 123b shown in FIG. 3. The syndrome generator 41 generates syndromes $S_0$–$S_3$ which are given by Equations 16. Syndromes $S_0$–$S_3$ are stored into a memory (RAM) 43 through a transfer bus (A-BUS) 42A. Syndromes $S_0$–$S_3$ are read out from the memory 43 whenever necessary. They are supplied through a transfer bus (B-BUS) 42B to an arithmetic logic unit (ALU) 44, a register (REG 1) 45A, a register (REG 2) 45B and a register (REG 3) 45C, thereby obtaining $S_a$, $S_b$ and $S_c$ which are represented by Equation 22.

The arithmetic logic unit 44 is so designed as to perform addition and multiplication on the elements of the Galois field. It includes a multiplier which will next be described.

Through the transfer bus 42A, $S_c$, $S_b$ and $S_a$ are supplied to a latch circuit (LAT-$S_c$) 46C, a latch circuit (LAT-$S_b$) 46B and a latch circuit (LAT-$S_a$) 45A, respectively. $S_c$, $S_b$ and $S_a$ are supplied to a latch circuit (LAT-1) 46D, a α multiplying register (REG×α) 47A and an $\alpha^2$ multiplying register (REG×$\alpha^2$) 47B, respectively, when a set pulse SP is supplied to the latch circuit 46D, the α multiplying register 47A and the $\alpha^2$ multiplying register 47B. At the same time, 1 is supplied to a r4 register (REG r4) 47C.

The α multiplying register 47A multiplies its contents by α upon receipt of a clock pulse CP. Similarly, the $\alpha^2$ multiplying register 47B multiplies its contents by $\alpha^2$ upon receipt of a clock pulse CP. The r4 register 47C is initially set to 1 and multiplies its contents by α every time it receives a clock pulse CP. In this embodiment, the r4 register 47C generates $\alpha^0$ to $\alpha^{31}$.

After $S_c$, $S_b$, $S_a$ and 1 have been stored into the latch circuit 46D, α multiplying register 47A, $\alpha^2$ multiplying register 47B and into r4 register 47C, respectively, 31 clock pulses CP are supplied, one after another, to the circuit 46D, register 47A, register 47B and register 47C, thus solving Equation 26 which is a quadratic equation. More precisely, output $S_c$ from the latch circuit 46D and output $S_b\alpha$ (=$S_b$x) from the α multiplying register 47B are supplied to an adder circuit (ADR1) 48A and are thus added together. Further, output $S_a\alpha^2$ (=$S_a x^2$) from the $\alpha^2$ multiplying register 47B and output $S_c + S_b\alpha$ (=$S_c = S_b$x) from the adder circuit 48A are supplied to an adder circuit (ADR2) 48B and are added together. As a result, there is found:

$$S_a\alpha^2 + S_b\alpha + S_c \ (= S_ax^2 + S_bx + S_c = f_{(x)}').$$

Then, x in quadratic Equation 26 is substituted by $\alpha^0$ to $\alpha^{31}$ as the 31 clock pulses CP are supplied. When $f_{(x)}' = 0$, the adder circuit (ADR2) 48B generates 0. If a zero detector (0-DET) 49 detects 0 twice, it means that the two roots of the quadratic equation have been determined.

When the zero detector (0-DET) 49 detects 0, it generates an output signal. The contents of the r4 register (REG r4) 47C are then stored into a latch circuit (LAT $\alpha^i$) 46E and a latch circuit (LAT $\alpha^j$) 46F, whereby $\alpha^i$ and $\alpha^j$ which define the location of the error can be determined. Data representing $\alpha^i$ and $\alpha^j$ are transferred to the arithmetic logic unit (ALU) 44 through the transfer bus (B-BUS) 42B. The arithmetic logic unit (ALU) 44 multiplies $\alpha^i$ by $\alpha^j$ as indicated by Equation 19 and adds $\alpha^i$ to $\alpha^j$ as indicated by Equation 18, thus generating error locations $\sigma_1$ and $\sigma_2$.

In generating error locations $\sigma_1$ and $\sigma_2$, an output from the $\alpha$ multiplying register (REG×$\alpha$) 47A is supplied to a gate circuit (GATE) 50. The gate circuit (GATE) 50 generates an output which represents the reciprocal of the output from the register (REG×$\alpha$) 47A (see the table given above). More specifically, when an output from the $\alpha$ multiplying register (REG×$\alpha$) 47A represents any value shown in the right column of the table (i.e., $\alpha^{32m}$ column), the gate circuit (GATE) 50 generates a load pulse. Data representing one of the values shown in the left column of the table (i.e., the $\alpha^{-32m}$ column), which is the reciprocal of the value represented by the output from the register (REG×$\alpha$) 47A, is then read from the gate circuit (GATE) 50 and stored into a latch circuit (LAT $\alpha^{-32m}$) 46G. At the same time, the contents of the r4 register (REG r4) 47C, i.e., data $\alpha^q$, are stored into a latch circuit (LAT $\alpha^q$) 46H. Hence, data representing $\alpha^q$ and $\alpha^{-32m}$ which is necessary for defining an error pattern is obtained.

The data representing $\alpha^q$ and the data representing $\alpha^{-32m}$ are transferred to the arithmetic logic unit (ALU) 44 through the transfer bus (B-BUS) 42B. Data representing $S_a$ is transferred also to the arithmetic logic unit (ALU) 44 through the transfer bus (B-BUS) 42B. The unit (ALU) 44 performs multiplication of $S_a \cdot \alpha^q \cdot \alpha^{-32m}$ as in Equation 30, thereby obtaining a reciprocal $(\alpha^i + \alpha^j)^{-1}$. Thereafter, the unit (ALU) 44 performs multiplication as given by Equation 21A' and addition as given by Equation 21B, thereby generating error patterns $e_1$ and $e_2$.

Using the error locations $\sigma_1$ and $\sigma_2$, and error patterns $e_1$ and $e_2$ thus generated, the error can be corrected according to the method described above with reference to FIG. 1.

Figure 5:
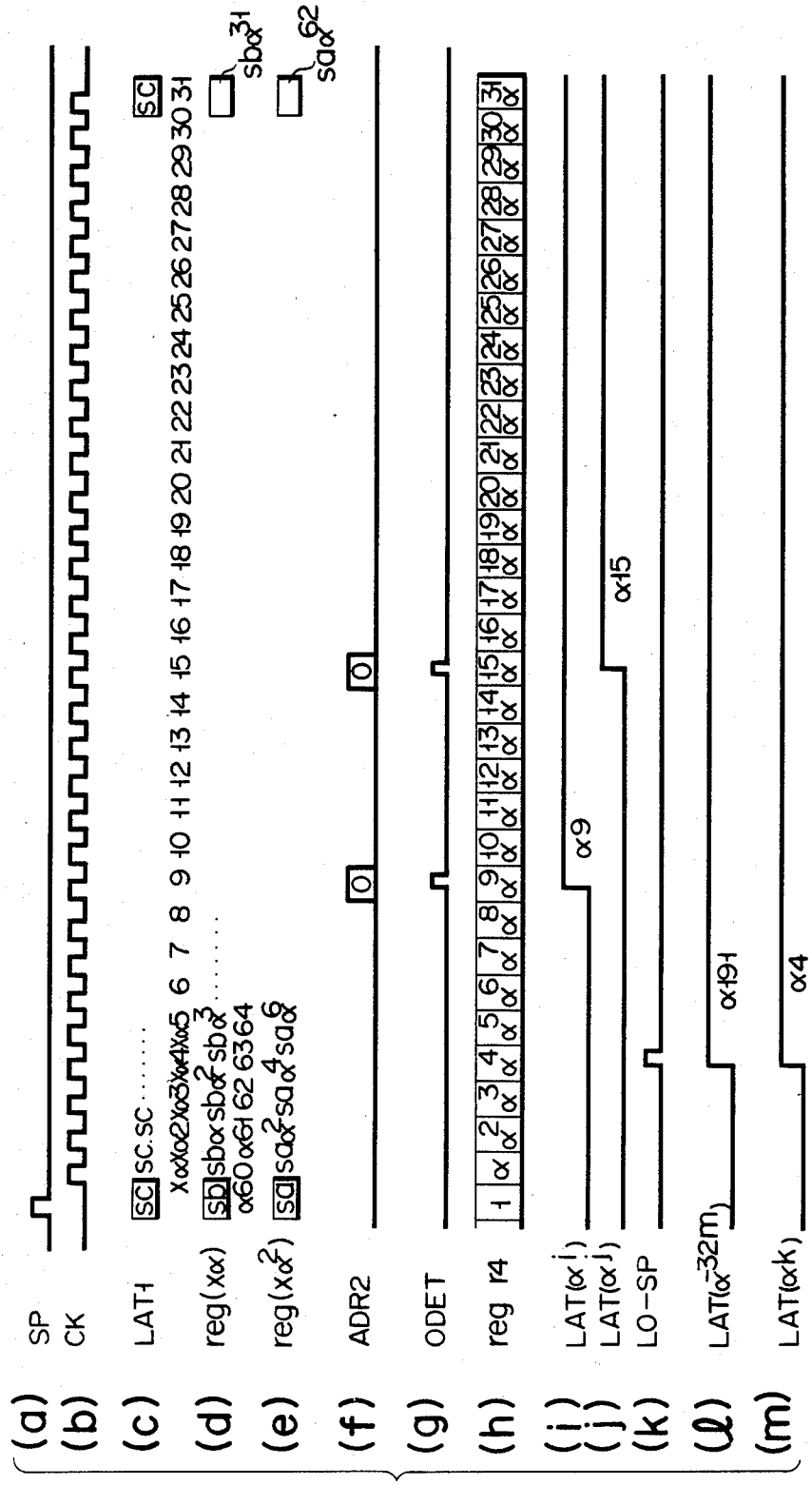
FIG. 5 is a timing chart illustrating the operation of the system shown in FIG. 4.

FIG. 5 is a timing chart illustrating, how to perform calculations when $S_b = S_a(\alpha^i + \alpha^j) = \alpha^{60}$, where $\alpha^i = \alpha^9$ and $\alpha^j = \alpha^{15}$. In FIG. 5, (a) is a set pulse SP, (b) is a clock pulse CP, (c) is the contents of the latch circuit (LAT 1), (d) is the contents of the $\alpha$ multiplying register (REG×$\alpha$), (e) is the contents of the $\alpha^2$ multiplying register (REG×$\alpha^2$), (f) is an output from the adder circuit (ADR2), (g) is an output from the zero detector (0-DET), (h) is the contents of the r4 register (REG r4), (i) is the contents of the latch circuit (LAT $\alpha^i$), (j) is the contents of the latch circuit (LAT $\alpha^j$), (k) is a load pulse from the gate circuit (GATE), (l) is the contents of the latch circuit (LAT $\alpha^{-32m}$), and (m) is the contents of the latch circuit (LAT $\alpha^q$).

Now the multiplier included in the arithmetic logic unit (ALU) 44 will be described. The multiplication of the elements of the Galois field can be expressed as follows:

$$A(\alpha) = B(\alpha) \cdot C(\alpha). \tag{31}$$

If $B(\alpha) = b_7\alpha^7 + b_6\alpha^6 + \ldots + b0$,
$C(\alpha) = c_7\alpha^7 + c_7\alpha^6 + \ldots + c_0$, then:

$$\begin{aligned} B(\alpha) \cdot C(\alpha) &= B(\alpha)[(c_7\alpha^6 + c_5\alpha^5 + c_3\alpha^2 + c_1) + \\ &\quad (c_6\alpha^6 + c_4\alpha^4 + c_2\alpha^2 + c_0)], \\ &= [\alpha B(\alpha)](c_7\alpha^6 + c_5\alpha^4 + c_3\alpha^2 + c_1) + \\ &\quad B(\alpha)(c_6\alpha^6 + c_4\alpha^4 + c_2\alpha^2 + c_0) \end{aligned}$$

where $\alpha$ is the root of the generator polynomial g(x) of the Galois field GF($2^8$).

Equation 31 implies that the first term in the right side can be determined in one step and the second term in the right side can be determined in another step.

FIG. 6 is a block diagram of the multiplier which is included in the arithmetic logic unit (ALU) 44. Multiplicand data B($\alpha$) is latched by a latch circuit 51, and multiplier data C($\alpha$) is latched by a latch circuit 52. An output from the latch circuit 51 is supplied to the first input terminal $IN_{11}$ of a selector circuit 54 and also to the second input teminal $IN_{12}$ of the circuit 54 through an $\alpha$ multiplying circuit 53. From the latch circuit 52 the coefficients $c_0$ to $c_7$ of the multiplier data C($\alpha$) are supplied at the same time to the seven input terminals of a selector circuit 55, respectively.

The selector circuits 54 and 55 are connected to receive a selector signal H/L. When a selector signal having a high level H is supplied to both selector circuits 54 and 55, the multiplier performs the multiplication given by the following Equation 32. Conversely, when a selector signal having a low level L is supplied to both selector circuits 54 and 55, the multiplier performs the multiplication given by Equation 33:

$$[\alpha B(\alpha)](c_7\alpha^6 + c_5\alpha^4 + c_3\alpha^2 + c_1) \tag{32}$$

$$B(\alpha)(c_6\alpha^6 + c_4\alpha^4 + c_2\alpha^2 + c_0). \tag{33}$$

The multiplier calculates Equation 32 in the following manner.

Upon receipt of a selector signal of a high level H, the selector circuit 54 selects the input data [$\alpha B(\alpha)$] supplied to its second input terminal $IN_{12}$, and the selector circuit 55 supplies output $c_1$, $c_3$, $c_5$ and $c_7$ from its first, second, third and fourth output terminals, respectively. Data [$\alpha B(\alpha)$] is supplied to a selector circuit 56 and also to an $\alpha^2$ multiplying circuit 57. The selector circuit 56 has its gate controlled by output $c_1$ from the selector circuit 55. Upon receipt of output $c_1$ the selector circuit 56 supplies an output [$\alpha B(\alpha)$] to one input terminal of an exclusive OR circuit 58. The $\alpha^2$ multiplying circuit 57 multiplies the input data [$\alpha B(\alpha)$] by $\alpha^2$, thereby generating an output [$\alpha^3 B(\alpha)$]. Output [$\alpha^3 B(\alpha)$] from the $\alpha^2$ multiplying circuit 57 is supplied to a selector circuit 59 and also to an $\alpha^2$ multiplying circuit 60.

The selector circuit 59 has its gate controlled by output $c_3$ from the selector circuit 55. Upon receipt of output $c_3$ it supplies an output [$\alpha^3 B(\alpha)$] to the other input terminal of the exclusive OR circuit 58. Output [$\alpha B(\alpha) + \alpha^3 B(\alpha)$] from the exclusive OR circuit 58 is supplied to one input terminal of an exclusive OR circuit 61.

In the meantime, the $\alpha^2$ multiplying circuit 60 multiplies the input data $[\alpha^2 B(\alpha)]$ by $\alpha^2$, thereby generating an output $[\alpha^5 B(\alpha)]$. Output $[\alpha^5 B(\alpha)]$ is supplied to a selector circuit 62 and also to an $\alpha^2$ multiplying circuit 63. The selector circuit 62 has its gate controlled by output $c_5$ from the selector circuit 55. Upon receipt of output $c_5$ it supplies an output $[\alpha^5 B(\alpha)]$ to the other input terminal of the exclusive OR circuit 61. Output $[\alpha B(\alpha) + \alpha^3 B(\alpha) + \alpha^5 B(\alpha)]$ from the exclusive OR circuit 61 is supplied to one input terminal of an exclusive OR circuit 63.

Meanwhile, the $\alpha^2$ multiplying circuit 64 multiplies the input data $[\alpha^5 B(\alpha)]$ by $\alpha^2$, thus generating an output $[\alpha^7 B(\alpha)]$. Output $[\alpha^7 B(\alpha)]$ is supplied to a selector circuit 65. The selector circuit 65 has its gate controlled by output $c_7$ from the selector circuit 55. Upon receipt of output $c_7$ it supplies an output $[\alpha^7 B(\alpha)]$ to the other input terminal of the exclusive OR circuit 63. Output $[\alpha B(\alpha) + \alpha^3 B(\alpha) + \alpha^5 B(\alpha) + \alpha^7 B(\alpha)]$ from the exclusive OR circuit 63 is supplied to a latch circuit 66 and also to one input terminal of an exclusive OR circuit 67. The output from the latch circuit 66 is supplied to the other input terminal of the exclusive OR circuit 67. The output from the exclusive OR circuit 67 is supplied to a latch circuit 68.

Briefly state, when a selector signal of a high level H is supplied the selector circuits 54 and 55, the latch circuit 66 will store data $[\alpha B(\alpha)](c_7\alpha^6 + c_5\alpha^4 + c_3\alpha^2 + c_1)$.

When a selector signal of a low level L is supplied to the selector circuits 54 and 55, the sequence of the above-mentioned steps will be carried out, thereby suppling data $B(\alpha)(c_6\alpha^6 + c_4\alpha^4 + c_2\alpha^2 + c_0)$ to one input terminal of the exclusive OR circuit 67. The output from the latch circuit 66 is supplied to the other input terminal of the exclusive OR circuit 67, whereby data of Equation 32 and data of Equation 33 are added together. As a result, data $B(\alpha) \cdot C(\alpha)$ given by Equation 31 is supplied to the latch circuit 68.

The latch circuits 51 and 52 are controlled by a latch signal $LP_1$ generated by a gate circuit 69 which is connected to receive 2-phase reference clocks $CP_1$ and $CP_2$. The latch circuit 66 is controlled by a latch signal $LP_2$ generated by the gate circuit 69. Similarly, the latch circuit 68 is controlled by a latch signal $LP_3$ generated by the gate circuit 69.

Figure 7:
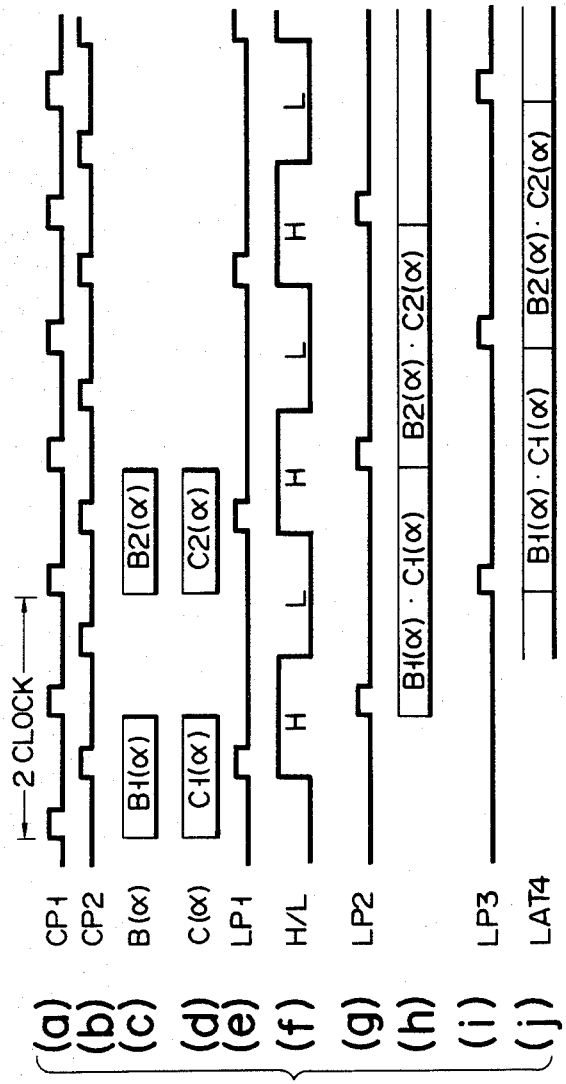
FIG. 7 is a timing chart illustrating the operation of the multiplier shown in FIG. 6.

FIG. 7 is a timing chart illustrating how the multiplier operates which is included in the arithmetic logic unit (ALU) 44. In FIG. 7, (a) is a reference clock $CP_1$, (b) is a reference clock $CP_2$, (c) indicates when to input the multiplicand data $B(\alpha)$, (d) indicates when to input the multiplier data $C(\alpha)$, (e) is a latch signal $LP_1$, (f) is a selector signal H/L, (g) is a latch signal $LP_2$, (h) indicates the timing of latching data in the latch circuit 66, (i) is a latch signal $LP_3$, and (j) indicates when data should be latched in the latch circuit 68.

Now, the $\alpha$ multiplying circuit 53 and the $\alpha^2$ multiplying circuits 57, 60 and 64 will be described in detail.

$\alpha$ is the root of the generator polynomial g(x) of the Galois field GF($2^8$), which is given by:

$$g(X) = x^8 + x^4 + x^3 + x^2 + 1.$$

Hence:
$$g(\alpha) = \alpha^8 + \alpha^4 + \alpha^3 + \alpha^2 + 1 = 0.$$

From the above equation:

$$\alpha^8 = \alpha^4 + \alpha^3 + \alpha^2 + 1. \qquad (34)$$

If multiplicand data $E(\alpha)$, which is given as follows, is multiplied by $\alpha$, the product can be expressed by the following equation (35) from equation (34):

$$E(\alpha) = E_7\alpha^7 + E_6\alpha^6 + \ldots + E_0, \qquad (35)$$

$$\begin{aligned} E(\alpha) \cdot \alpha &= E_7\alpha^8 + E_6\alpha^7 + \ldots + E_0\alpha \\ &= E_6\alpha^7 + E_5\alpha^6 + E_4\alpha^5 + (E_3 + E_7)\alpha^4 + \\ &\quad (E_2 + E_7)\alpha^3 + (E_1 + E_7)\alpha^2 + E_0\alpha + E_7, \\ &= F_7\alpha^7 + F_6\alpha^6 + F_5\alpha^5 + F_4\alpha^4 + F_3\alpha^3 + \\ &\quad F_2\alpha^2 + F_1\alpha + F_0. \end{aligned}$$

Figure 8:
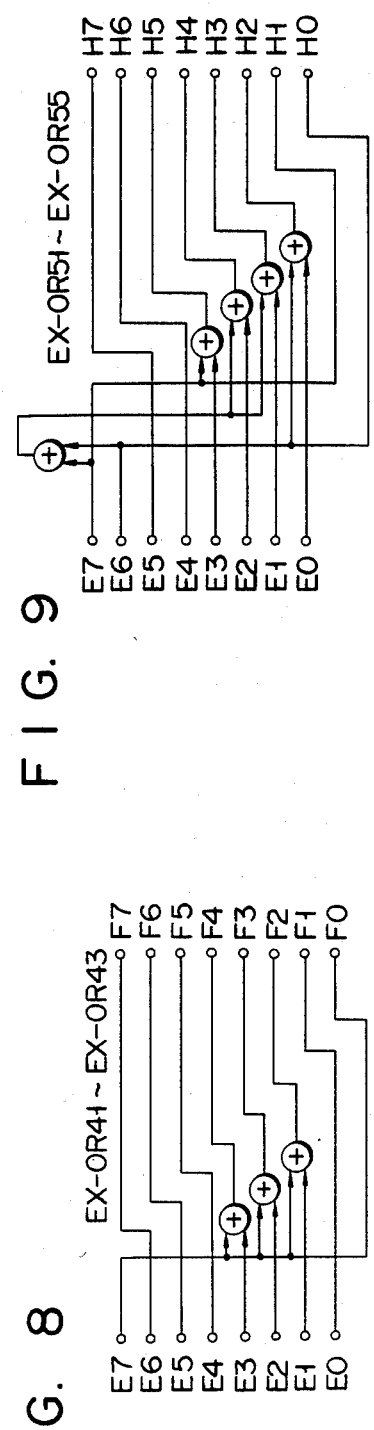
FIG. 8 is a circuit diagram an $\alpha$ multiplier circuit used in the multiplier shown in FIG. 6.

Equation 35 means that the $\alpha$ multiplying circuit 53 may be comprised of exclusive OR circuits (EX-OR$_{41}$) to (EX-OR$_{43}$) as shown in FIG. 8.

Product $E(\alpha) \cdot \alpha^2$ can be expressed as follows:

$$\begin{aligned} E(\alpha) \cdot \alpha^2 &= E_6\alpha^8 + E_5\alpha^7 + E_4\alpha^6 + (E_2 + E_7)\alpha^4 + \quad (36) \\ &\quad (E_1 + E_7)\alpha^3 + E_0\alpha^2 + E_7\alpha, \\ &= E_5\alpha^7 + E_4\alpha^6 + (E_3 + E_7)\alpha^5 + \\ &\quad (E_2 + E_6 + E_7)\alpha^4 + (E_1 + E_6 + E_7)\alpha^3 + \\ &\quad (E_0 + E_6)\alpha^2 + E_7\alpha + E_7, \\ &= H_7\alpha^7 + H_6\alpha^6 + H_5\alpha^5 + H_4\alpha^4 + H_3\alpha^3 + \\ &\quad H_2\alpha^2 + H_1\alpha + H_0. \end{aligned}$$

Figure 9:
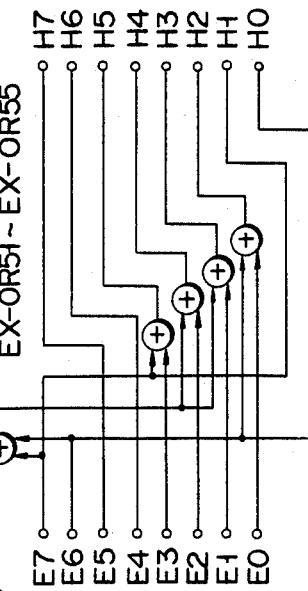
FIG. 9 is a circuit diagram of $\alpha^2$ multiplier circuits used in the multiplier shown in FIG. 6.

It is obvious from Equation 36 that the $\alpha^2$ multiplying circuits 57, 60 and 64 can be comprised of exclusive OR circuits (EX-OR$_{51}$) to (EX-OR$_{55}$) as illustrated in FIG. 9.

The present invention is not limited to the embodiment described above. Variations are possible within the spirit of the invention, and the invention may be applied to devices other than a DAD device. For instance, the error data correcting system of the invention can be used in combination with an apparatus for recording digital data such as PCM codes on a magnetic tape, for reproducing the data from the tape and for transmitting the data.

As described above in detail, the error data correcting system according to the invention can perform multiplication and addition on the elements of a Galois field thereby locating errors and generating error patterns without using a memory having a large capacity, such as a logarithm buffer or an antilogarithm buffer. The system is therefore simple, inexpensive, and can process data at a high speed.

We claim:

1. An error correcting system which receives double correction BCH codes each consisting of M data symbols and four parity symbols, each consisting of m bits and represented by the following generated polynomial:

$$g(x) = (x+1)(x+\alpha)(x+\alpha^2)(x+\alpha^3),$$

where $\alpha$ is the origin element of Galois field GF($2^m$), and which find the roots of the following error location polynomial:

$$f(x) = x^2 + \sigma_1 x + \sigma_2,$$

thereby correcting errors in the double correction BCH codes, said system comprising:
means for storing the double correction BCH codes;

syndrome generating means for generating four syndromes $S_0$, $S_1$, $S_2$ and $S_3$ from the double correction BCH codes;
error location calculating means comprising:
a first multiplying/adding section for multiplying and adding the four syndromes $S_0$, $S_1$, $S_2$ and $S_3$ to obtain three syndromes $S_a$, $S_b$ and $S_c$ which are given as follows:
$S_a = S_1^2 + S_0 S_2$, $S_b = S_0 S_3 + S_1 S_2$, $S_c = S_1 S_3 + S_2^2$ a second multiplying/adding section for performing multiplication and addition by substituting $\alpha^0 - \alpha^{M+3}$ for x in the following polynomial obtained by transforming said error location polynomial $f_{(x)}$:

$f'(x) = S_a f(x) = S_a x^2 + S_b x + S_c$, thereby obtaining two products $S_a \cdot \alpha^2$ and $S_b \cdot \alpha$ and a sum $S_a \alpha^2 + S_b \alpha + S_c$, utilizing the fact that the coefficients $\sigma_1$, $\sigma_2$ of said error location polynomial $f_{(x)}$ and the three syndromes $S_a$, $S_b$ and $S_c$ have the following relations according to the theory on the correction of said double correction BCH codes:

$\sigma_1 = S_b/S_a = \alpha^i + \alpha^j$, $\sigma_2 = S_c/S_a = \alpha^i \alpha^j$;

an $\alpha^i$, $\alpha^j$ detecting section for detecting $\alpha^i$ and $\alpha^j$ which satisfy $f'(x) = 0$; and
a third multiplying/adding section for adding $\alpha^i$ and $\alpha^j$ and multiplying $\alpha^i$ by $\alpha^j$, thereby finding the coefficients $\sigma_1$, $\sigma_2$ which define error locations;
error pattern calculating means comprising a fourth multiplying/adding means for obtaining an error pattern $e_i$ from $\alpha^i$ and $\alpha^j$ by performing the following multiplication:

$e_i = (S_0 \alpha^j + S_1)(\alpha^i + \alpha^j)^{-1}$, said equation having been derived from the following division:

$$e_i = \frac{S_0 \alpha^j + S_1}{\alpha^i + \alpha^j},$$

and for obtaining another error pattern $e_j$ by performing the following addition:

$e_j = S_0 + e_i$; and correction means for correcting the errors in said double correction codes stored by said code storing means in accordance with the coefficients $\sigma_1$, $\sigma_2$ and the error patterns $e_i$, $e_j$.

2. An error correcting system according to claim 1, wherein said first, third and fourth multiplying/adding sections are comprised of one section.

3. An error correcting system according to claim 1, wherein said fourth multiplying/adding section includes means for finding a reciprocal component $(\alpha^i + \alpha^j)^{-1}$ which is used to obtain the error pattern $e_i$ and which is given by the following equation:

$(\alpha^i + \alpha^j)^{-1} = Sa \cdot \alpha^{-(M+4)m}$, where $\alpha^q$ is the value for x which satisfies $Sa(\alpha^i + \alpha^j)x = \alpha^{(M+4)}$, said means comprising:
gate circuit means having $2^m - 1/M+4$ gates forming a table $[\alpha^{(M+4)m} : \alpha^{-(M+4)m}]$;
latch circuit means for latching $\alpha^{-(M+4)m}$ stored in said gate circuit means and coincident to $S_b \alpha$, which is output from said second multiplying/adding section, and latching $\alpha^0 - \alpha^{M+3}$ as data $\alpha^q$ when $S_b$ is output from said second multiplying/adding section; and
multiplying means for multiplying $\alpha^{-(M+4)m}$, $S_a$ and $\alpha^q$.

4. An error correcting system according to claim 1, wherein said first, third and fourth multiplying/adding sections each include a muliplier unit which performs the following multiplication:
$B(\alpha) \cdot C(\alpha) = M_1 + M_2$, where:
$B(\alpha) = b_{m-1} \alpha^{m-1} + b_{m-2} \alpha^{m-2} + \ldots + b_0$, $C(\alpha) = C_{m-1} \alpha^{m-1} + C_{m-2} \alpha^{m-2} + \ldots + C_0$, provided that:
$M_1 = \{\alpha B(\alpha)\}(C_{m-1} \alpha^{m-2} + C_{m-2} \alpha^{m-4} + \ldots + C_3 \alpha^2 + C_1)$ $M_2 = B(\alpha)(C_{m-2} \alpha^{m-2} + C_{m-4} \alpha^{m-4} + \ldots + C_2 \alpha^2 + C_0)$, said multiplier unit comprising:
a first multiplier circuit for performing a multiplication to find $M_1$ in a first step;
a second multiplier circuit for performing a multiplication to find $M_2$ in a second step; and
an adder circuit for adding the outputs from the first and second multiplier circuits.

* * * * *